(12) United States Patent
Lin et al.

(10) Patent No.: US 10,741,644 B2
(45) Date of Patent: Aug. 11, 2020

(54) SEMICONDUCTOR DEVICES WITH VIA STRUCTURE AND PACKAGE STRUCTURES COMPRISING THE SAME

(71) Applicant: Delta Electronics, Inc., Taoyuan (TW)

(72) Inventors: Shiau-Shi Lin, Taoyuan (TW); Tzu-Hsuan Cheng, Taoyuan (TW); Hsin-Chang Tsai, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 189 days.

(21) Appl. No.: 15/358,469

(22) Filed: Nov. 22, 2016

(65) Prior Publication Data

US 2018/0145018 A1    May 24, 2018

(51) Int. Cl.

| | | |
|---|---|---|
| *H01L 29/08* | (2006.01) | |
| *H01L 23/522* | (2006.01) | |
| *H01L 29/66* | (2006.01) | |
| *H01L 23/367* | (2006.01) | |
| *H01L 23/31* | (2006.01) | |

(52) U.S. Cl.
CPC ...... *H01L 29/0891* (2013.01); *H01L 23/5226* (2013.01); *H01L 29/66856* (2013.01); *H01L 29/66863* (2013.01); *H01L 29/66962* (2013.01); *H01L 23/3121* (2013.01); *H01L 23/367* (2013.01); *H01L 2224/16245* (2013.01); *H01L 2924/13063* (2013.01)

(58) Field of Classification Search
CPC ........... H01L 23/49844; H01L 23/3171; H01L 23/367; H01L 23/49827; H01L 23/49861; H01L 29/2003; H01L 23/34; H01L 23/3672; H01L 23/28; H01L 23/3157; H01L 23/3185; H01L 23/488; H01L 23/495; H01L 23/498; H01L 29/66856; H01L 29/66863; H01L 29/66962; H01L 29/0891; H01L 2924/13063

See application file for complete search history.

(56) References Cited

U.S. PATENT DOCUMENTS

| | | | | |
|---|---|---|---|---|
| 5,070,386 | A | | 12/1991 | Imura |
| 5,153,683 | A | * | 10/1992 | Noda ................ H01L 21/28581 257/280 |
| 5,504,352 | A | * | 4/1996 | Tsutsui ............. H01L 21/28587 257/194 |
| 5,693,969 | A | * | 12/1997 | Weitzel ............... H01L 21/2815 257/280 |
| 5,888,859 | A | * | 3/1999 | Oku .................. H01L 21/28587 257/E21.314 |

(Continued)

FOREIGN PATENT DOCUMENTS

| | | |
|---|---|---|
| CN | 1450601 A | 10/2003 |
| TW | 201320396 | 5/2013 |

(Continued)

*Primary Examiner* — Scott B Geyer
(74) *Attorney, Agent, or Firm* — Muncy, Geissler, Olds & Lowe, P.C.

(57) ABSTRACT

A semiconductor device is provided. The semiconductor device includes a substrate; an active layer disposed on the substrate; a via through the active layer; and a plurality of electrodes disposed on the active layer and into the via. Additionally, a package structure that includes the semiconductor device is also provided. The electrode is electrically connected to the substrate through the via.

26 Claims, 5 Drawing Sheets

(56) References Cited

U.S. PATENT DOCUMENTS

| | | | | |
|---|---|---|---|---|
| 5,907,177 A * | 5/1999 | Uda | H01L 21/28581 | 257/412 |
| 6,221,753 B1 * | 4/2001 | Seyyedy | H01L 21/563 | 228/180.22 |
| 6,429,471 B1 * | 8/2002 | Yokoyama | H01L 21/28575 | 257/200 |
| 8,546,937 B2 * | 10/2013 | Machida | H01L 23/49541 | 257/717 |
| 8,969,915 B2 * | 3/2015 | Lee | H01L 29/2003 | 257/183 |
| 9,099,460 B2 * | 8/2015 | Cho | H01L 21/565 | |
| 2003/0082860 A1 * | 5/2003 | Yoshida | H01L 21/28575 | 438/184 |
| 2005/0189562 A1 * | 9/2005 | Kinzer | H01L 27/0605 | 257/192 |
| 2009/0140295 A1 * | 6/2009 | Kaya | H01L 29/0611 | 257/192 |
| 2012/0012990 A1 * | 1/2012 | Pagaila | H01L 21/561 | 257/659 |
| 2012/0211885 A1 * | 8/2012 | Choi | H01L 23/3128 | 257/737 |
| 2012/0211901 A1 * | 8/2012 | Shimizu | H01L 24/29 | 257/783 |
| 2013/0248874 A1 * | 9/2013 | Kuraguchi | H01L 29/778 | 257/76 |
| 2013/0299982 A1 * | 11/2013 | Pagaila | H01L 21/568 | 257/738 |
| 2014/0374801 A1 * | 12/2014 | Ikeda | H01L 23/492 | 257/195 |
| 2015/0034972 A1 * | 2/2015 | Kuraguchi | H01L 29/267 | 257/77 |
| 2015/0270192 A1 * | 9/2015 | Bar | H01L 23/367 | 257/706 |
| 2016/0181174 A1 * | 6/2016 | Gambino | H01L 23/367 | 257/499 |
| 2016/0320689 A1 * | 11/2016 | Butterworth | H01L 33/58 | |
| 2017/0287872 A1 * | 10/2017 | Shen | H01L 25/0655 | |
| 2017/0345812 A1 * | 11/2017 | Chou | H01L 27/0255 | |

FOREIGN PATENT DOCUMENTS

| | | |
|---|---|---|
| TW | 201442183 A | 11/2014 |
| TW | 201547018 A | 12/2015 |

* cited by examiner

SEMICONDUCTOR DEVICES WITH VIA STRUCTURE AND PACKAGE STRUCTURES COMPRISING THE SAME

BACKGROUND OF THE INVENTION

Field of the Invention

The invention relates to a semiconductor device, and more particularly to a semiconductor device with an active layer of a specific material having vias therethrough and a package structure comprising the same.

Description of the Related Art

In the semiconductor industry, the production of integrated circuits (IC) has mainly three stages: wafer fabrication, IC fabrication, and IC packaging. Chips (dies) are manufactured by performing the steps related to wafer fabrication, circuit design, photomask fabrication, cutting the wafer, and so on. Each individual chip obtained by cutting the wafer can be electrically connected to external signals via contacts on the chip, and an encapsulation material may then be employed to encapsulate the chip. The IC packaging process is thus completed. Said packaging process is to prevent the chip from being affected by moisture, heat, noise, and so forth; while at the same time, the packaging process is capable of providing a medium for electrical connection between the chip and the external circuitry.

With enhanced IC integration, the chip package structure tends to become more and more complicated and diversified. As demand for higher performance and higher density increases, integrated circuit devices continuously need to include more components and dies to meet the requirements of different applications. As such, components may be stacked on top of each other or placed closer on printed circuit boards (PCB) to reduce the dimensions, as well as the cost, of the device. For example, in a multi-die integrated circuit package, multiple dies may be stacked on top of each other.

However, the use of higher-performing and higher-powered integrated circuit devices may lead problems related to heat dissipation. Excessive heat generated by the numerous dies in a multi-die integrated circuit package may cause components within the package to malfunction.

Therefore, the development of a package structure which is capable of removing excessive heat generated in a variety of ways, for example, a dual-side heat dissipation manner, is desirable.

BRIEF SUMMARY OF THE INVENTION

One embodiment of the invention provides a semiconductor device comprising a substrate; an active layer disposed on the substrate; a via through the active layer; and a plurality of electrodes disposed on the active layer and into the via.

In some embodiments, the substrate is a silicon-based substrate.

In some embodiments, the active layer is a nitride-based layer.

In some embodiments, the active layer comprises gallium nitride (GaN).

In some embodiments, the electrode is electrically connected to the substrate through the via.

In some embodiments, the electrodes are laterally disposed on the active layer.

In some embodiments, the electrodes comprise a source electrode, a drain electrode and a gate electrode.

In some embodiments, the source electrode is electrically connected to the substrate through the via.

One embodiment of the invention provides a package structure comprising a conductive structure, a semiconductor device, and an encapsulation material. The semiconductor device is connected to the conductive structure. The semiconductor device comprises a substrate, an active layer, a via, and a plurality of electrodes. The substrate has a first side and a second side. The active layer is disposed on the first side of the substrate. The vias pass through the active layer. The electrodes are disposed on the active layer and into the via. The encapsulation material covers the semiconductor device and a part of the conductive structure, exposing the second side of the substrate and a part of the conductive structure.

In some embodiments, the conductive structure comprises a leadframe, a metal foil, or an electroplating material In some embodiments, the conductive structure is further connected to a printed circuit board (PCB).

In some embodiments, the package structure further comprises a thermal dissipating component disposed on the second side of the substrate and the encapsulation material.

In some embodiments, the thermal dissipating component may comprise a heat sink or a heat slug.

One embodiment of the invention provides a package structure comprising a semiconductor device comprising a substrate, an active layer, a via, and an electrode, wherein the active layer is disposed between the substrate and the electrode, and the active layer comprises the via electrically connected with the electrode and the substrate, and the via through the active layer; a conductive structure disposed on the electrode; and an encapsulation material surrounding the semiconductor device and the conductive structure, wherein a part of the semiconductor device and a part of the conductive structure are exposed from the encapsulation material.

Compared to a conventional III-V group-doping silicon substrate, in the present invention, a novel layer—the active layer with the specific material (e.g., GaN)—is disposed on the silicon substrate for subsequent disposition of the electrodes. The disclosed semiconductor device having the lateral source/drain/gate electrodes and the specific material (e.g., GaN) of the active layer disposed between the source/drain/gate electrodes and the silicon substrate is suitable for high-current and high-frequency applications. In such a device structure, one of the electrodes (e.g., the source electrode) is electrically connected to the silicon substrate through the vias which are formed through the active layer such that the silicon substrate possesses stable electrical properties and has the same electric potential as the electrode (e.g., the source electrode) connected therewith. This is capable of stabilizing the functionality of the active layer above the silicon substrate.

In the package structure disclosed, in addition to removal of heat from the printed circuit board (PCB) side connected with the conductive structure (i.e. a leadframe, a metal foil or an electroplating material), the heat generated is also removed from the other side of the substrate (i.e. the side uncovered by the encapsulation material) combined with the thermal dissipating component or the heat sink in the package structure, achieving a dual-side heat dissipation effect.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
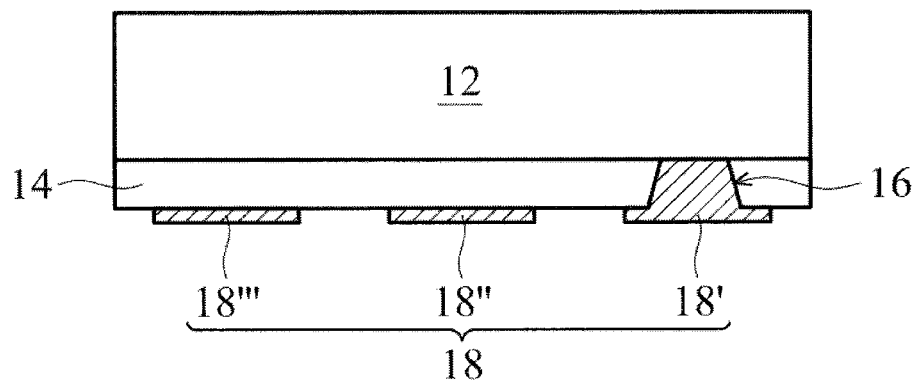
FIG. 1 is a cross-sectional view of a semiconductor device in accordance with one embodiment of the invention.

Referring to FIG. 1, in accordance with one embodiment of the invention, a semiconductor device 10 is provided. FIG. 1 is a cross-sectional view of the semiconductor device 10.

The semiconductor device 10 comprises a substrate 12, an active layer 14, a via 16, and a plurality of electrodes 18, for example, a first electrode 18', a second electrode 18" and a third electrode 18'". The active layer 14 is disposed on the substrate 12. The via 16 is formed through the active layer 14. The electrodes 18 are disposed on the active layer 14 and into the via 16.

In some embodiments, the substrate 12 may be a silicon-based substrate or a silicon-containing substrate.

In some embodiments, the active layer 14 may be a nitride-based layer, for example, a gallium nitride (GaN) layer.

In some embodiments, the electrodes 18 may comprise a source electrode, a drain electrode and a gate electrode, for example, the first electrode 18' serving as the source electrode, the second electrode 18" serving as the drain electrode and the third electrode 18'" serving as the gate electrode.

In some embodiments, the electrodes 18 may be laterally disposed on the active layer 14, for example, the source electrode (i.e. the first electrode 18') and the drain electrode (i.e. the second electrode 18") are laterally disposed on the active layer 14 (i.e. disposition on the same plane). Therefore, the semiconductor device 10 may be a lateral power component, for example, a lateral high-power component.

In some embodiments, one of the electrodes 18 may be electrically connected to the substrate 12 through the via 16, for example, the source electrode (i.e. the first electrode 18') is electrically connected to the substrate 12 through the via 16.

Figure 2:
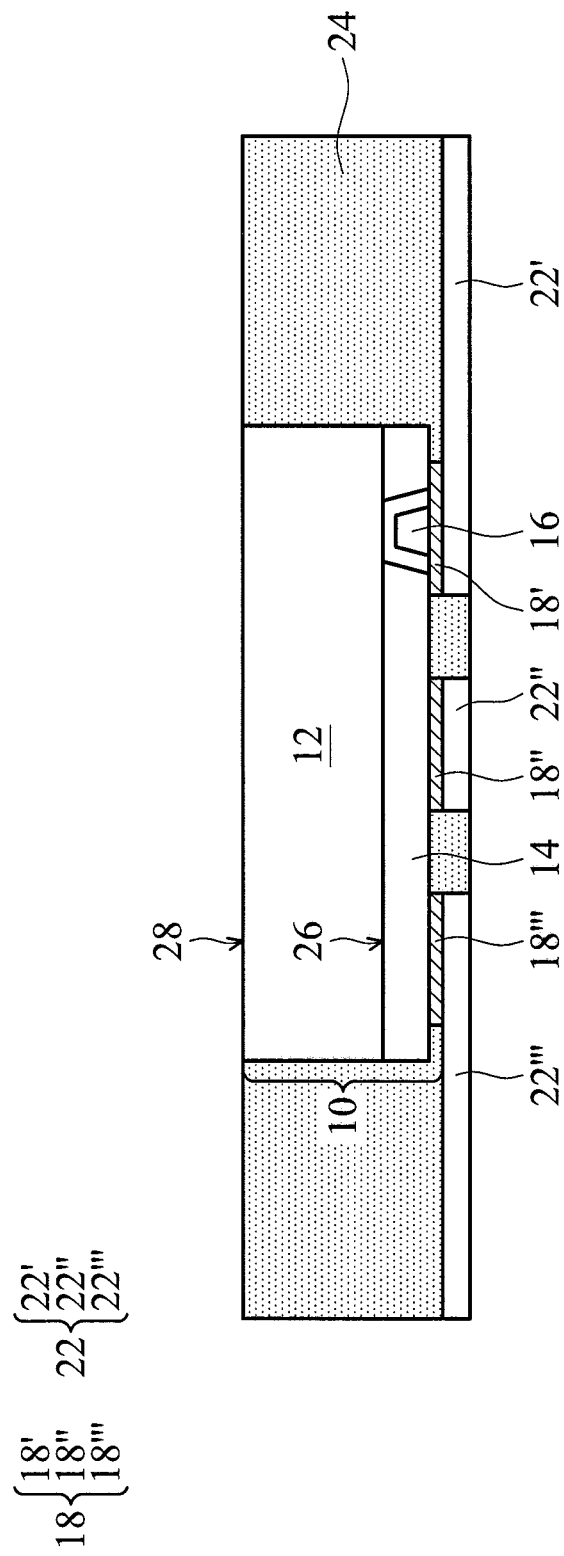
FIG. 2 is a cross-sectional view of a package structure in accordance with one embodiment of the invention.

Referring to FIG. 2, in accordance with one embodiment of the invention, a package structure 20 is provided. FIG. 2 is a cross-sectional view of the package structure 20.

The package structure 20 comprises a conductive structure 22, a semiconductor device 10 and an encapsulation material 24. The semiconductor device 10 is connected to the conductive structure 22. The encapsulation material 24 covers the semiconductor device 10 and a part of the conductive structure 22.

The semiconductor device 10 comprises a substrate 12 having a first side 26 and a second side 28, an active layer 14, a via 16, and a plurality of electrodes 18, for example, a first electrode 18', a second electrode 18" and a third electrode 18'". The active layer 14 is disposed on the first side 26 of the substrate 12. The via 16 is formed through the active layer 14. The electrodes 18 are disposed on the active layer 14 and into the via 16. Specifically, the second side 28 of the substrate 12 and a part of the conductive structure 22 uncovered by the encapsulation material 24 are exposed to the outside.

In some embodiments, the conductive structure 22 may comprise a leadframe or a metal foil or an electroplating material.

In this embodiment, the conductive structure 22 is a leadframe. In some embodiments, the leadframe 22 may comprise a plurality of connection portions, for example, a first connection portion 22', a second connection portion 22" and a third connection portion 22'".

In some embodiments, the connection portions of the leadframe 22 may comprise low-voltage connection portions and high-voltage connection portions, for example, the first connection portion 22' of the leadframe 22 serving as a low-voltage connection portion and the second connection portion 22" of the leadframe 22 serving as a high-voltage connection portion.

In some embodiments, the substrate 12 may be a silicon-based substrate or a silicon-containing substrate.

In some embodiments, the active layer 14 may be a nitride-based layer, for example, a gallium nitride (GaN) layer.

In some embodiments, the electrodes 18 may comprise a source electrode, a drain electrode and a gate electrode, for example, the first electrode 18' serving as the source electrode, the second electrode 18" serving as the drain electrode and the third electrode 18'" serving as the gate electrode.

In some embodiments, the electrodes 18 may be laterally disposed on the active layer 14, for example, the source electrode (i.e. the first electrode 18') and the drain electrode (i.e. the second electrode 18") are laterally disposed on the active layer 14 (i.e. disposition on the same plane). Therefore, the semiconductor device 10 may be a lateral power component, for example, a lateral high-power component.

In some embodiments, one of the electrodes 18 may be electrically connected to the substrate 12 through the via 16, for example, the source electrode (i.e. the first electrode 18') is electrically connected to the substrate 12 through the via 16.

In some embodiments, the source electrode (i.e. the first electrode 18') may be connected to the low-voltage connection portion (i.e. the first connection portion 22') of the leadframe 22 and the drain electrode (i.e. the second electrode 18") may be connected to the high-voltage connection portion (i.e. the second connection portion 22") of the leadframe 22. The electrodes 18 disposed above the substrate 12 of the semiconductor device 10 are connected to the connection portions of the leadframe 22. Therefore, the invention adopts a flip chip technology to attach the reverse semiconductor device 10 on the leadframe 22.

Figure 3:
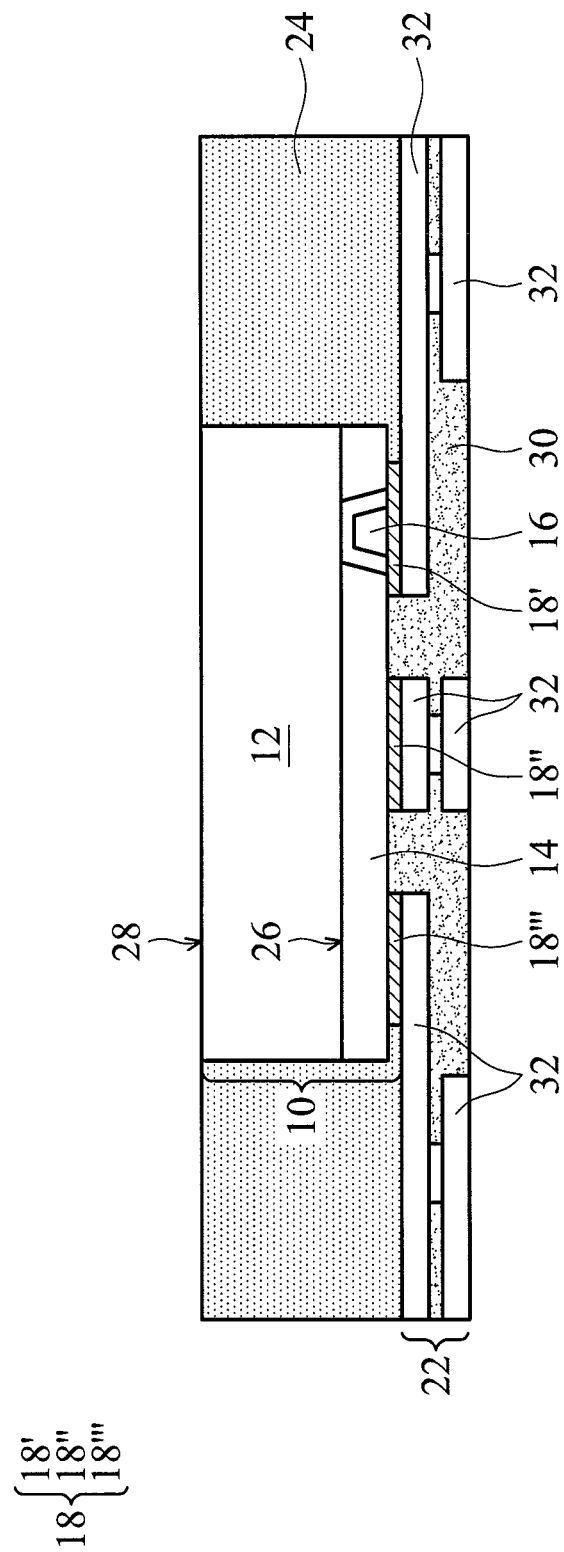
FIG. 3 is a cross-sectional view of a package structure in accordance with one embodiment of the invention.

Referring to FIG. 3, in accordance with one embodiment of the invention, a package structure 20 is provided. FIG. 3 is a cross-sectional view of the package structure 20.

The package structure 20 comprises a conductive structure 22, a semiconductor device 10 and an encapsulation material 24. The semiconductor device 10 is connected to the conductive structure 22. The encapsulation material 24 covers the semiconductor device 10 and a part of the conductive structure 22.

The semiconductor device 10 comprises a substrate 12 having a first side 26 and a second side 28, an active layer 14, a via 16, and a plurality of electrodes 18, for example, a first electrode 18', a second electrode 18" and a third electrode 18'". The active layer 14 is disposed on the first side 26 of the substrate 12. The via 16 is formed through the active layer 14. The electrodes 18 are disposed on the active layer 14 and into the via 16. Specifically, the second side 28 of the substrate 12 and a part of the conductive structure 22 uncovered by the encapsulation material 24 are exposed to the outside.

In some embodiments, the conductive structure 22 may comprise a leadframe, a metal foil or an electroplating material. In this embodiment, the conductive structure 22 is an electroplating material serving as a redistribution layer (RDL) structure.

In some embodiments, the redistribution layer structure 22 may be disposed on the electrodes 18 of the semiconductor device 10.

In some embodiments, the redistribution layer structure 22 may comprise a plurality of insulation layers 30 and a plurality of metal layers 32 stacked with each other, as shown in FIG. 3.

In some embodiments, the insulation layer 30 of the redistribution layer structure 22 may comprise epoxy material.

In some embodiments, the metal layer 32 of the redistribution layer structure 22 may comprise leadframe, metal foil or electroplating material.

In some embodiments, the substrate 12 may be a silicon-based substrate or a silicon-containing substrate.

In some embodiments, the active layer 14 may be a nitride-based layer, for example, a gallium nitride (GaN) layer.

In some embodiments, the electrodes 18 may comprise a source electrode, a drain electrode and a gate electrode, for example, the first electrode 18' serving as the source electrode, the second electrode 18" serving as the drain electrode and the third electrode 18'" serving as the gate electrode.

In some embodiments, the electrodes 18 may be laterally disposed on the active layer 14, for example, the source electrode (i.e. the first electrode 18') and the drain electrode (i.e. the second electrode 18") are laterally disposed on the active layer 14 (i.e. disposition on the same plane). Therefore, the semiconductor device 10 may be a lateral power component, for example, a lateral high-power component.

In some embodiments, one of the electrodes 18 may be electrically connected to the substrate 12 through the via 16, for example, the source electrode (i.e. the first electrode 18') is electrically connected to the substrate 12 through the via 16.

Figure 4:
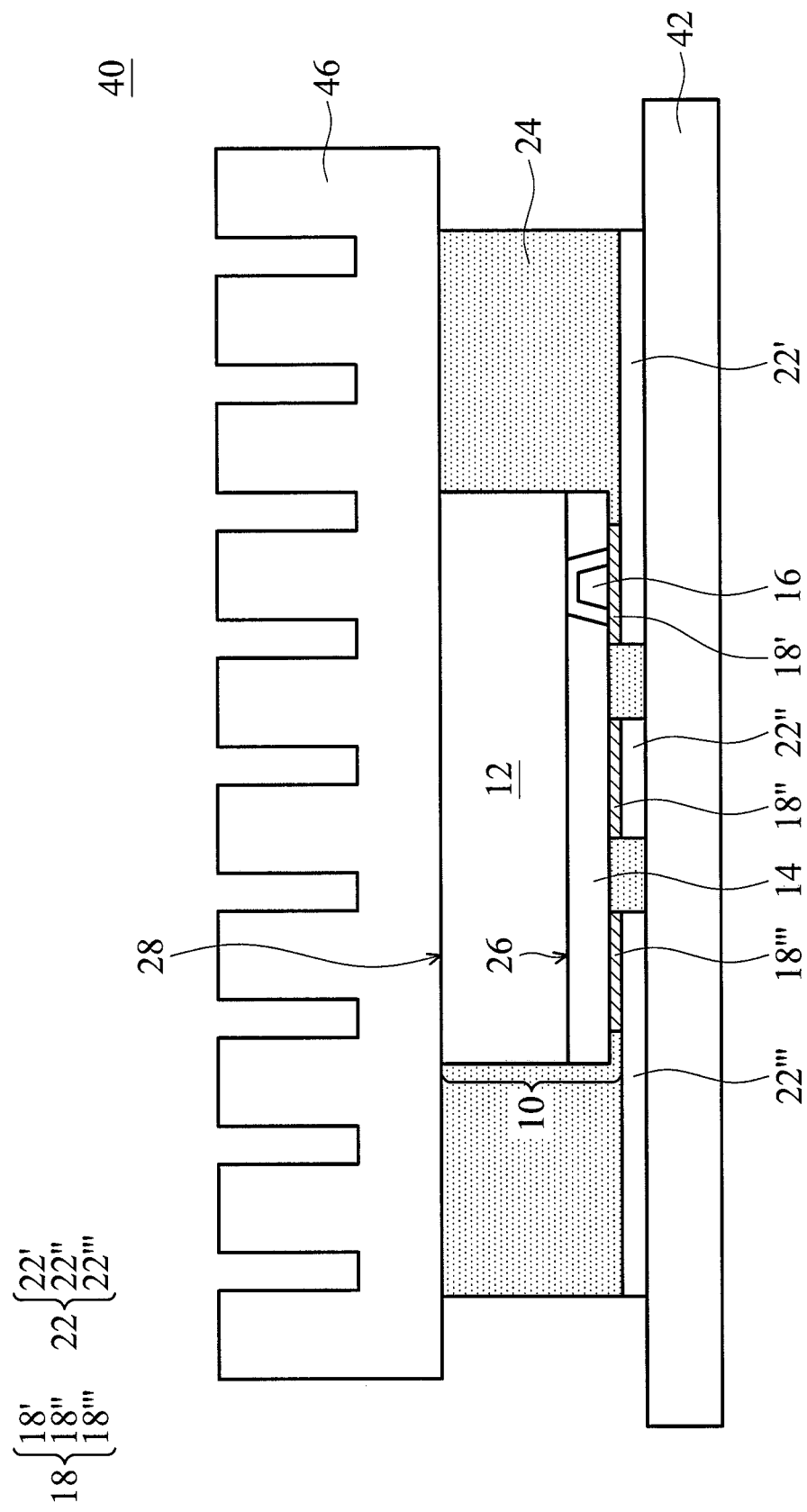
FIG. 4 is a cross-sectional view of a package structure in accordance with one embodiment of the invention.

Referring to FIG. 4, in accordance with one embodiment of the invention, a package structure 40 is provided. FIG. 4 is a cross-sectional view of the package structure 40.

The package structure 40 comprises a conductive structure 22, a semiconductor device 10 and an encapsulation material 24. The semiconductor device 10 is connected to the conductive structure 22. The encapsulation material 24 covers the semiconductor device 10 and a part of the conductive structure 22.

The semiconductor device 10 comprises a substrate 12 having a first side 26 and a second side 28, an active layer 14, a via 16, and a plurality of electrodes 18, for example, a first electrode 18', a second electrode 18" and a third electrode 18'". The active layer 14 is disposed on the first side 26 of the substrate 12. The via 16 is formed through the active layer 14. The electrodes 18 are disposed on the active layer 14 and into the via 16. Specifically, the second side 28 of the substrate 12 and a part of the conductive structure 22 uncovered by the encapsulation material 24 are exposed to the outside.

In some embodiments, the conductive structure 22 may comprise a leadframe, a metal foil or an electroplating material. In this embodiment, the conductive structure 22 is a leadframe.

In some embodiments, the leadframe 22 may comprise a plurality of connection portions, for example, a first connection portion 22', a second connection portion 22" and a third connection portion 22'".

In some embodiments, the connection portions of the leadframe 22 may comprise low-voltage connection portions and high-voltage connection portions, for example, the first connection portion 22' of the leadframe 22 serving as a low-voltage connection portion and the second connection portion 22" of the leadframe 22 serving as a high-voltage connection portion.

In some embodiments, the substrate 12 may be a silicon-based substrate or a silicon-containing substrate.

In some embodiments, the active layer 14 may be a nitride-based layer, for example, a gallium nitride (GaN) layer.

In some embodiments, the electrodes 18 may comprise a source electrode, a drain electrode and a gate electrode, for example, the first electrode 18' serving as the source electrode, the second electrode 18" serving as the drain electrode and the third electrode 18'" serving as the gate electrode.

In some embodiments, the electrodes 18 may be laterally disposed on the active layer 14, for example, the source electrode (i.e. the first electrode 18') and the drain electrode (i.e. the second electrode 18") are laterally disposed on the active layer 14 (i.e. disposition on the same plane). Therefore, the semiconductor device 10 may be a lateral power component, for example, a lateral high power component.

In some embodiments, one of the electrodes 18 may be electrically connected to the substrate 12 through the via 16, for example, the source electrode (i.e. the first electrode 18') is electrically connected to the substrate 12 through the via 16.

In some embodiments, the source electrode (i.e. the first electrode 18') may be connected to the low-voltage connection portion (i.e. the first connection portion 22') of the leadframe 22 and the drain electrode (i.e. the second electrode 18") may be connected to the high-voltage connection portion (i.e. the second connection portion 22") of the leadframe 22. The electrodes 18 disposed above the substrate 12 of the semiconductor device 10 are connected to the connection portions of the leadframe 22. Therefore, the invention adopts a flip chip technology to attach the reverse semiconductor device 10 on the leadframe 22.

In some embodiments, the conductive structure 22 may further be connected to a printed circuit board (PCB) 42.

In some embodiments, package structure 40 may further comprise a thermal dissipating component 46 disposed on the second side 28 of the substrate 12 and the encapsulation material 24.

In some embodiments, the thermal dissipating component 46 may comprise a heat sink or a heat slug.

Figure 5:
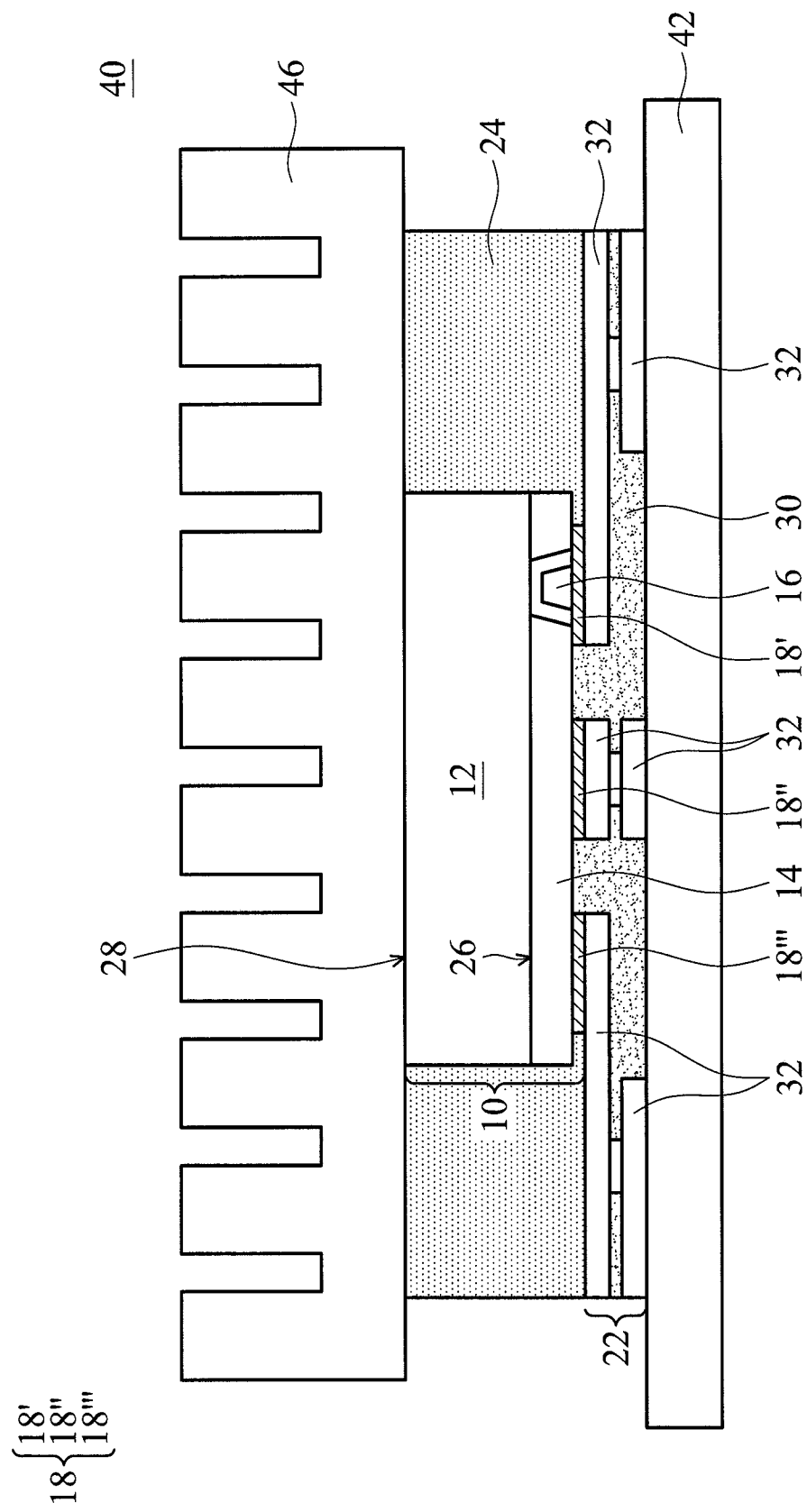
FIG. 5 is a cross-sectional view of a package structure in accordance with one embodiment of the invention.

Referring to FIG. 5, in accordance with one embodiment of the invention, a package structure 40 is provided. FIG. 5 is a cross-sectional view of the package structure 40.

The package structure 40 comprises a conductive structure 22, a semiconductor device 10 and an encapsulation material 24. The semiconductor device 10 is connected to the conductive structure 22. The encapsulation material 24 covers the semiconductor device 10 and a part of the conductive structure 22.

The semiconductor device 10 comprises a substrate 12 having a first side 26 and a second side 28, an active layer 14, a via 16, and a plurality of electrodes 18, for example, a first electrode 18', a second electrode 18" and a third electrode 18'". The active layer 14 is disposed on the first side 26 of the substrate 12. The via 16 is formed through the active layer 14. The electrodes 18 are disposed on the active layer 14 and into the via 16. Specifically, the second side 28 of the substrate 12 and a part of the conductive structure 22 uncovered by the encapsulation material 24 are exposed to the outside.

In some embodiments, the conductive structure 22 may comprise a leadframe, a metal foil or an electroplating material. In this embodiment, the conductive structure 22 is an electroplating material serving as a redistribution layer (RDL) structure.

In some embodiments, the redistribution layer structure 22 may be disposed on the electrodes 18 of the semiconductor device 10.

In some embodiments, the redistribution layer structure 22 may comprise a plurality of insulation layers 30 and a plurality of metal layers 32 stacked with each other, as shown in FIG. 5.

In some embodiments, the insulation layer 30 of the redistribution layer structure 22 may comprise epoxy material.

In some embodiments, the metal layer 32 of the redistribution layer structure 22 may comprise leadframe, metal foil or electroplating material.

In some embodiments, the substrate 12 may be a silicon-based substrate or a silicon-containing substrate.

In some embodiments, the active layer 14 may be a nitride-based layer, for example, a gallium nitride (GaN) layer.

In some embodiments, the electrodes 18 may comprise a source electrode, a drain electrode and a gate electrode, for example, the first electrode 18' serving as the source electrode, the second electrode 18" serving as the drain electrode and the third electrode 18'" serving as the gate electrode.

In some embodiments, the electrodes 18 may be laterally disposed on the active layer 14, for example, the source electrode (i.e. the first electrode 18') and the drain electrode (i.e. the second electrode 18") are laterally disposed on the active layer 14 (i.e. disposition on the same plane). Therefore, the semiconductor device 10 may be a lateral power component, for example, a lateral high-power component.

In some embodiments, one of the electrodes 18 may be electrically connected to the substrate 12 through the vias 16, for example, the source electrode (i.e. the first electrode 18') is electrically connected to the substrate 12 through the vias 16.

In some embodiments, the conductive structure 22 may further be connected to a printed circuit board (PCB) 42.

In some embodiments, package structure 40 may further comprise a thermal dissipating component 46 disposed on the second side 28 of the substrate 12 and the encapsulation material 24.

In some embodiments, the thermal dissipating component 46 may comprise a heat sink or a heat slug.

Compared to a conventional III-V group-doping silicon substrate, in the present invention, a novel layer—the active layer with the specific material (e.g., GaN)—is disposed on the silicon substrate for subsequent disposition of the electrodes. The disclosed semiconductor device having the lateral source/drain/gate electrodes and the specific material (e.g., GaN) of the active layer disposed between the source/drain/gate electrodes and the silicon substrate is suitable for high-current and high-frequency applications. In such a device structure, one of the electrodes (e.g., the source electrode) is electrically connected to the silicon substrate through the vias which are formed through the active layer such that the silicon substrate possesses stable electrical properties and has the same electric potential as the electrode (e.g., the source electrode) connected therewith. This is capable of stabilizing the functionality of the active layer above the silicon substrate.

In the package structure disclosed, in addition to removal of heat from the printed circuit board (PCB) side connected with the conductive structure (i.e. a leadframe, a metal foil or an electroplating material), the heat generated is also removed from the other side of the substrate (i.e. the side uncovered by the encapsulation material) combined with the thermal dissipating component or the heat sink in the package structure, achieving a dual-side heat dissipation effect.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a substrate;
an active layer disposed on the substrate;
a via through the active layer; and
a source electrode, a drain electrode and a gate electrode in contact with the active layer and the via is completely filled with the source electrode.

2. The semiconductor device as claimed in claim 1, wherein the substrate is a silicon-based substrate.

3. The semiconductor device as claimed in claim 1, wherein the active layer is a nitride-based layer.

4. The semiconductor device as claimed in claim 1, wherein the active layer comprises gallium nitride (GaN).

5. The semiconductor device as claimed in claim 1, wherein the electrode is electrically connected to the substrate through the via.

6. The semiconductor device as claimed in claim 1, wherein the electrodes are laterally disposed on the active layer.

7. A package structure, comprising:
a conductive structure;
a semiconductor device connected to the conductive structure, wherein the semiconductor device comprises a substrate having a first side and a second side, an active layer disposed on the first side of the substrate, a via through the active layer and a plurality of electrodes disposed on the active layer and one of the plurality of electrodes into the via; and an encapsulation material covering the semiconductor device and a part of the conductive structure, exposing the second side of the substrate and a part of the conductive structure.

8. The package structure as claimed in claim 7, wherein the conductive structure comprises a leadframe, a metal foil or an electroplating material.

9. The package structure as claimed in claim 7, wherein the substrate is a silicon-based substrate.

10. The package structure as claimed in claim 7, wherein the active layer is a nitride-based layer.

11. The package structure as claimed in claim 7, wherein the active layer comprises gallium nitride.

12. The package structure as claimed in claim 7, wherein the electrode is connected to the substrate through the via.

13. The package structure as claimed in claim 7, wherein the electrodes are laterally disposed on the active layer.

14. The package structure as claimed in claim 7, wherein the electrodes comprise a source electrode, a drain electrode and a gate electrode.

15. The package structure as claimed in claim 14, wherein the source electrode is connected to the substrate through the via.

16. The package structure as claimed in claim 7, wherein the conductive structure is further connected to a printed circuit board (PCB).

17. The package structure as claimed in claim 7, further comprising a thermal dissipating component disposed on the second side of the substrate and the encapsulation material.

18. The package structure as claimed in claim 17, wherein the thermal dissipating component comprises a heat sink.

19. A package structure, comprising:
a semiconductor device comprising a substrate, an active layer, a via, and an electrode, wherein the active layer is disposed between the substrate and the electrode, and the active layer comprises the via electrically connected with the electrode and the substrate, and the via through the active layer;
a conductive structure disposed on the electrode; and
an encapsulation material surrounding the semiconductor device and the conductive structure, wherein a part of the semiconductor device and a part of the conductive structure are exposed from the encapsulation material.

20. The package structure as claimed in claim 19 wherein the substrate is a silicon-based substrate.

21. The package structure as claimed in claim 19, wherein the active layer is a nitride-based region.

22. The package structure as claimed in claim 19, wherein the active layer comprises gallium nitride.

23. The package structure as claimed in claim 19, wherein the conductive structure comprises a leadframe, a metal foil or an electroplating material.

24. The package structure as claimed in claim 19, wherein the conductive structure is further connected to a printed circuit board (PCB).

25. The package structure as claimed in claim 19, further comprising a thermal dissipating component disposed on the semiconductor device and the encapsulation material.

26. The package structure as claimed in claim 25, wherein the thermal dissipating component comprises a heat sink.

* * * * *